(12) United States Patent
Hayashi et al.

(10) Patent No.: US 9,843,318 B2
(45) Date of Patent: Dec. 12, 2017

(54) BUFFER CIRCUIT

(71) Applicant: Mitsubishi Electric Corporation, Tokyo (JP)

(72) Inventors: Kei Hayashi, Tokyo (JP); Kazuaki Hiyama, Tokyo (JP); Kentaro Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/897,392

(22) PCT Filed: Sep. 6, 2013

(86) PCT No.: PCT/JP2013/074115
§ 371 (c)(1),
(2) Date: Dec. 10, 2015

(87) PCT Pub. No.: WO2015/033444
PCT Pub. Date: Mar. 12, 2015

(65) Prior Publication Data
US 2016/0134271 A1 May 12, 2016

(51) Int. Cl.
*H03B 1/00* (2006.01)
*H03K 3/00* (2006.01)
(Continued)

(52) U.S. Cl.
CPC ....... *H03K 17/08* (2013.01); *H03K 17/08128* (2013.01); *H03K 17/162* (2013.01);
(Continued)

(58) Field of Classification Search
CPC ......... H03K 17/08; H03K 17/60; H03K 17/74
(Continued)

(56) References Cited

U.S. PATENT DOCUMENTS 3,244,910 A * 4/1966 Leifer .............. H03K 17/04126
327/486
3,375,455 A * 3/1968 Motta .................... H03F 3/343
327/307

(Continued)

FOREIGN PATENT DOCUMENTS

JP S52-099755 A 8/1977
JP 60-169936 11/1985
(Continued)

OTHER PUBLICATIONS

Notification Concerning Transmittal of International Preliminary Report on Patentability and Translation of Written Opinion of the International Searching Authority; PCT/JP2013/074115 dated Mar. 17, 2016.

(Continued)

*Primary Examiner* — Thomas Skibinski
(74) *Attorney, Agent, or Firm* — Studebaker & Brackett PC

(57) ABSTRACT

It is an object of the present invention to provide a buffer circuit that reduces a reverse voltage applied to transistors being a complementary pair during turn-on and turn-off. A buffer circuit is a buffer circuit that turns on and turns off a switching element and includes a drive-side element that has an end connected to a base of a drive transistor and a sink-side element that has an end connected to a base of a sink transistor. The drive-side element and the sink-side element are respectively a drive-side diode and a sink-side diode, or a drive-side capacitor and a sink-side capacitor.

3 Claims, 9 Drawing Sheets

(51) Int. Cl.
*H03K 17/08* (2006.01)
*H03K 17/0812* (2006.01)
*H03K 17/16* (2006.01)
*H03K 17/60* (2006.01)
*H03K 17/74* (2006.01)

(52) U.S. Cl.
CPC .......... *H03K 17/168* (2013.01); *H03K 17/60* (2013.01); *H03K 17/74* (2013.01)

(58) Field of Classification Search
USPC ............... 327/108–112, 419, 427, 434, 437; 326/82, 83, 87
See application file for complete search history.

(56) References Cited

U.S. PATENT DOCUMENTS

| | | | | |
|---|---|---|---|---|
| 3,423,683 A | * | 1/1969 | Whitaker | G06F 7/588 327/164 |
| 3,444,393 A | * | 5/1969 | Sassler | G06G 7/184 327/336 |
| 3,585,407 A | | 6/1971 | Vinson | |
| 4,103,245 A | * | 7/1978 | Yokoyama | H01L 29/08 257/E29.029 |
| 4,239,989 A | * | 12/1980 | Brajder | H03K 17/041 323/289 26 |
| 4,412,141 A | * | 10/1983 | Jacobsen | H03K 17/667 327/532 |
| 6,154,069 A | * | 11/2000 | Ebihara | G09G 3/3696 327/111 |
| 6,836,161 B2 | * | 12/2004 | Akiyama | H03K 17/0406 327/108 |
| 2010/0239303 A1 | | 9/2010 | Matsumoto | |

FOREIGN PATENT DOCUMENTS

| | | |
|---|---|---|
| JP | 02-004010 | 1/1990 |
| JP | 02-302123 | 12/1990 |
| JP | 07-245557 | 9/1995 |
| JP | 2010-130557 | 6/2010 |
| JP | 2010-226845 | 10/2010 |
| JP | 2010-233310 | 10/2010 |
| JP | 2013-005474 | 1/2013 |

OTHER PUBLICATIONS

International Search Report—PCT/JP2013/074115, dated Nov. 12, 2013.

"Hybrid Kit for HybridPACK™2 Evaluation Kit for Applications with HybridPACK™2 Module," infineon, Application Note, V2.3, Mar. 2011, p. 30.

An Office Action; "Notification of Reason(s) for Refusal" issued by the Japanese Patent Office dated Nov. 8, 2016, which corresponds to Japanese Patent Application No. 2015-535239 and is related to U.S. Appl. No. 14/897,392; with English language translation.

\* cited by examiner

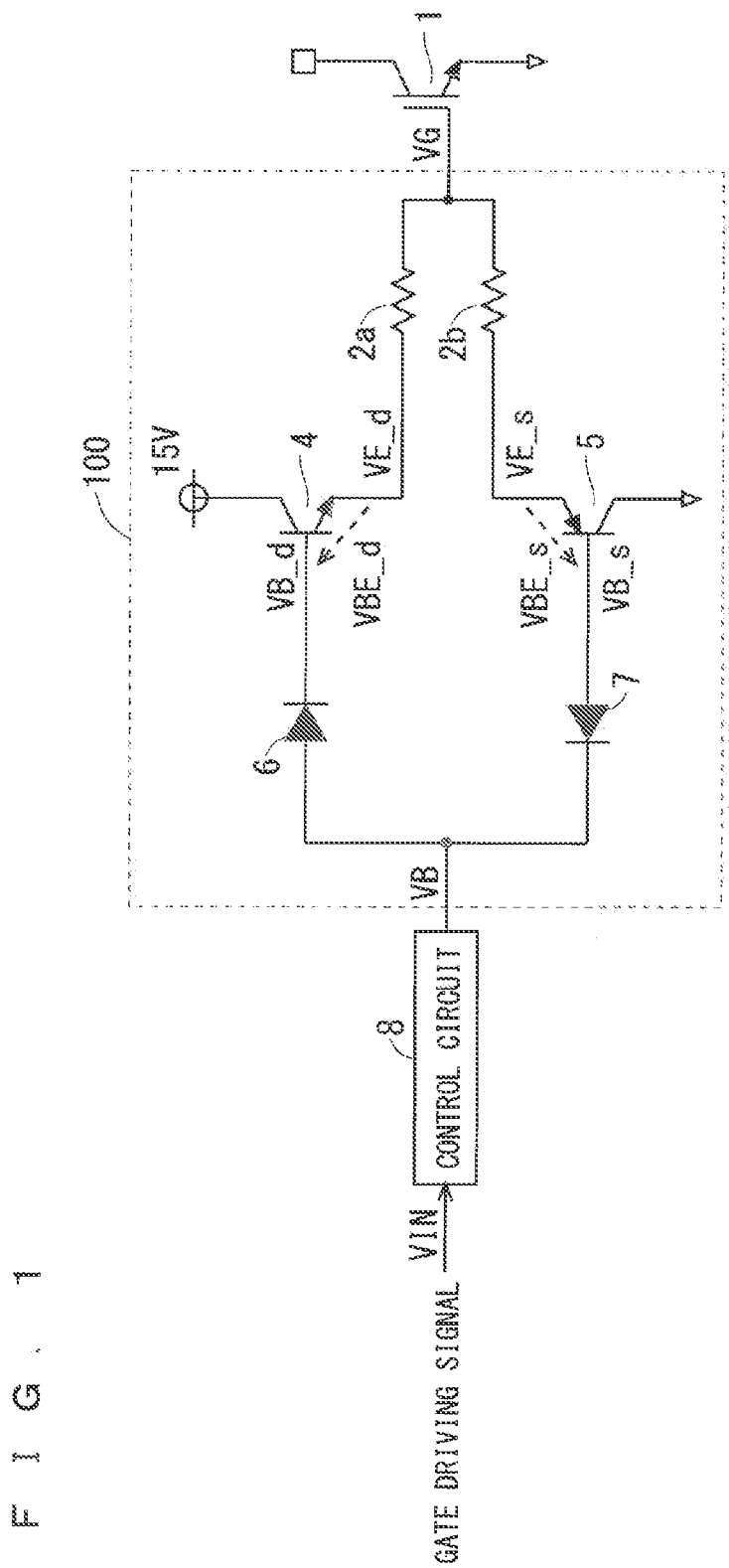
F I G. 1

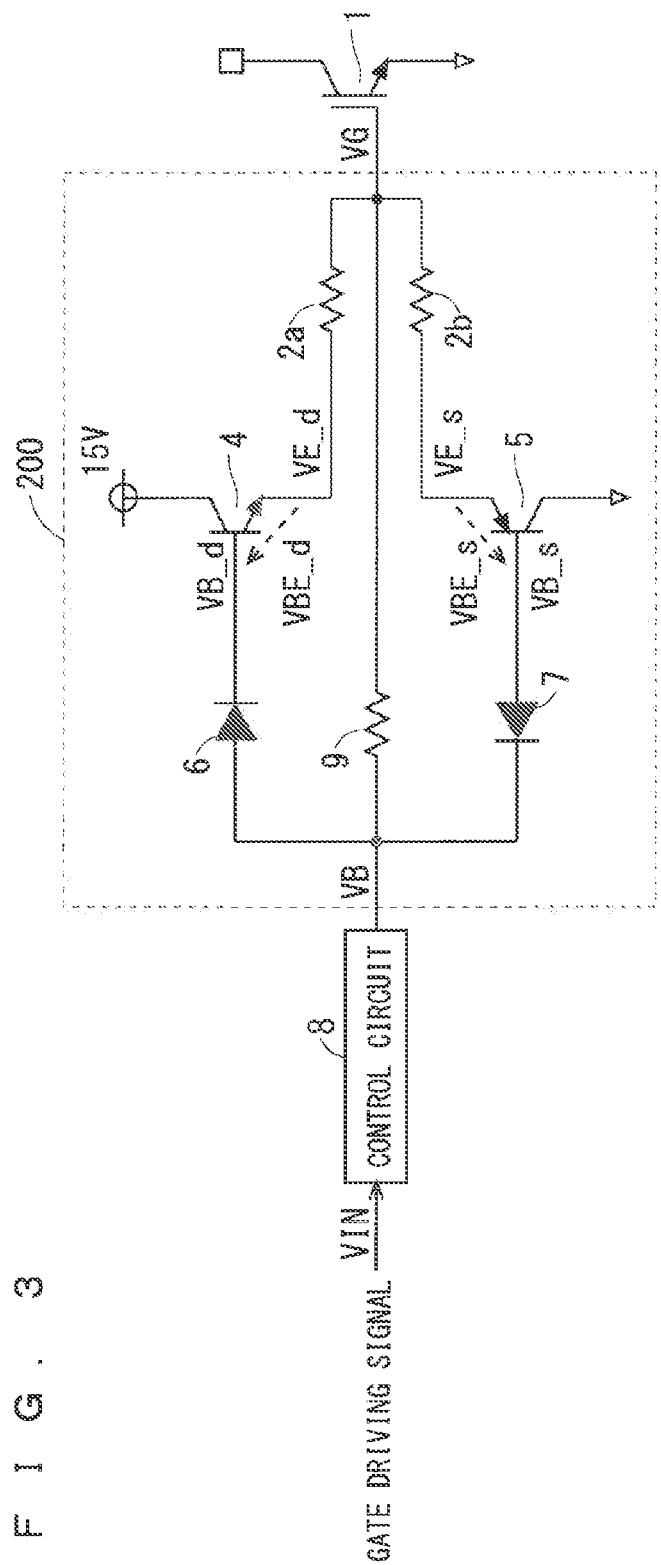
F I G . 3

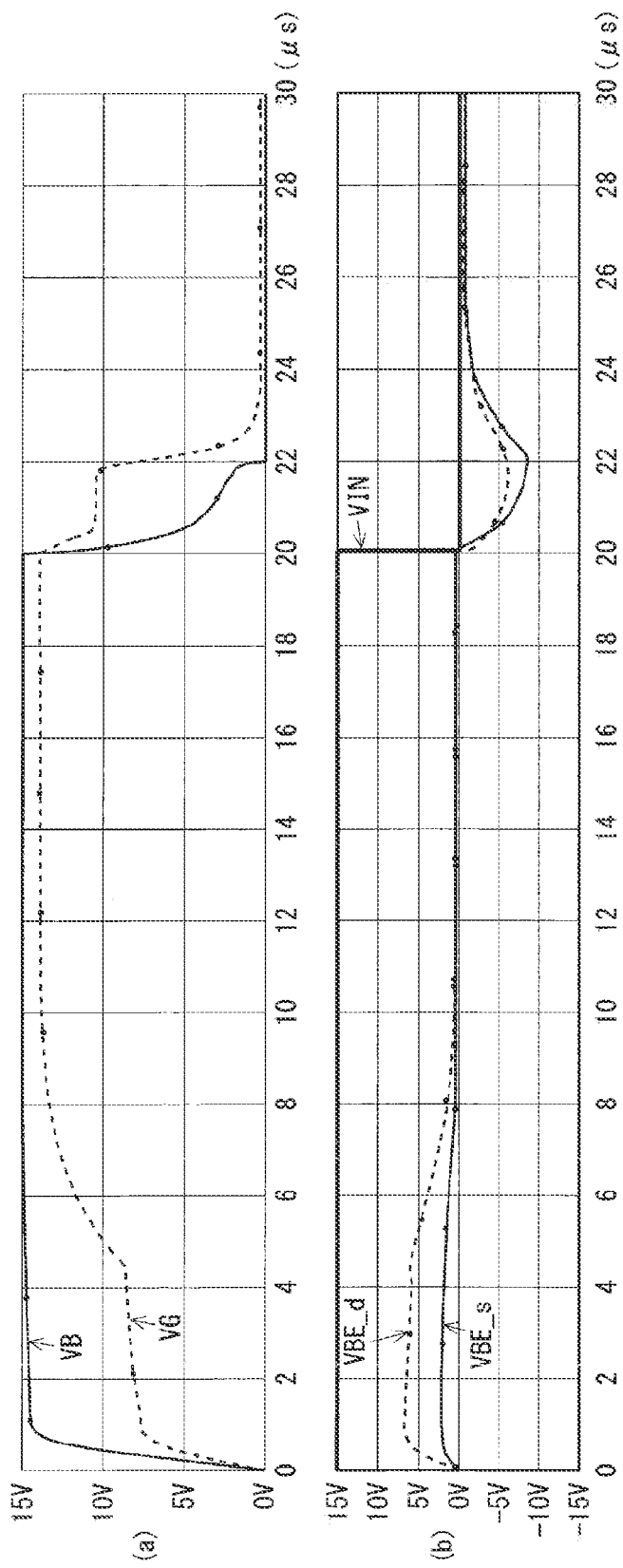
F I G . 6

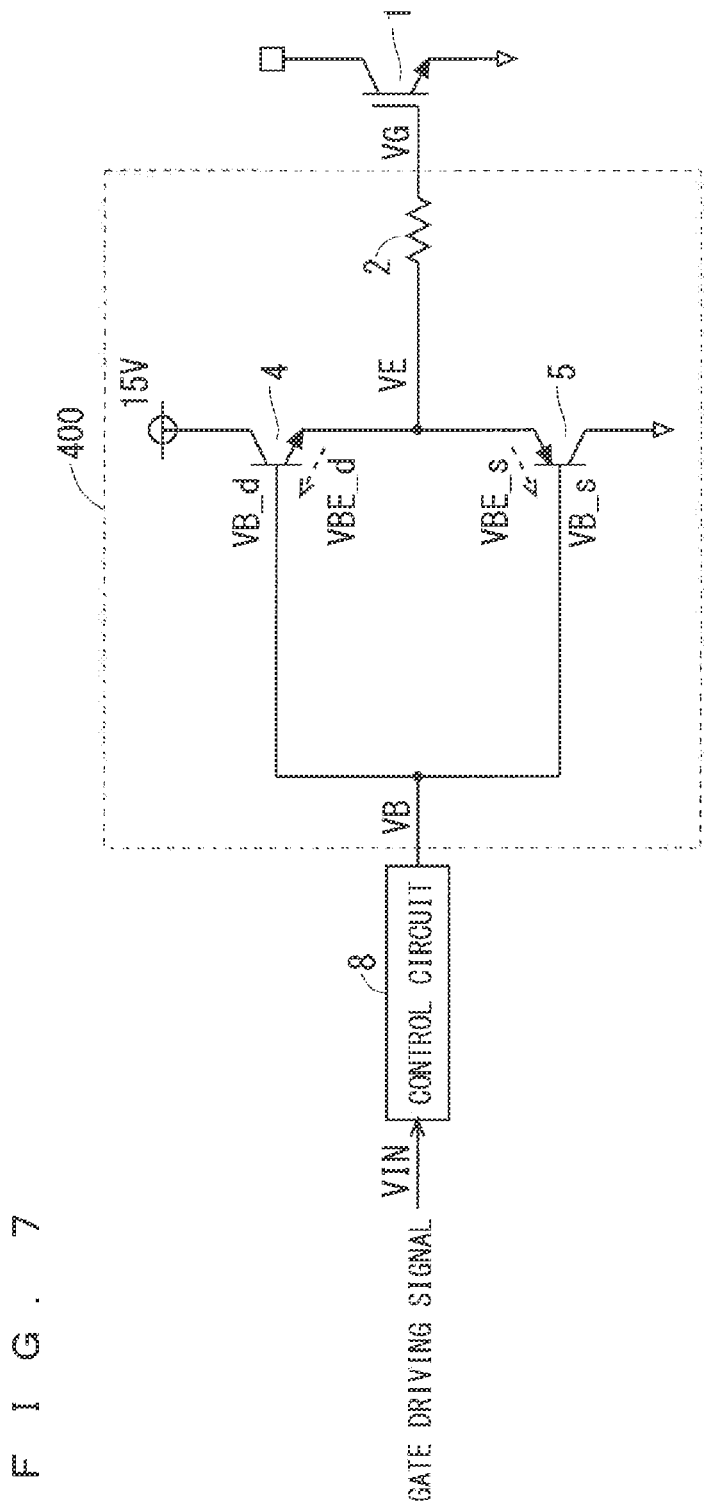
F I G . 7

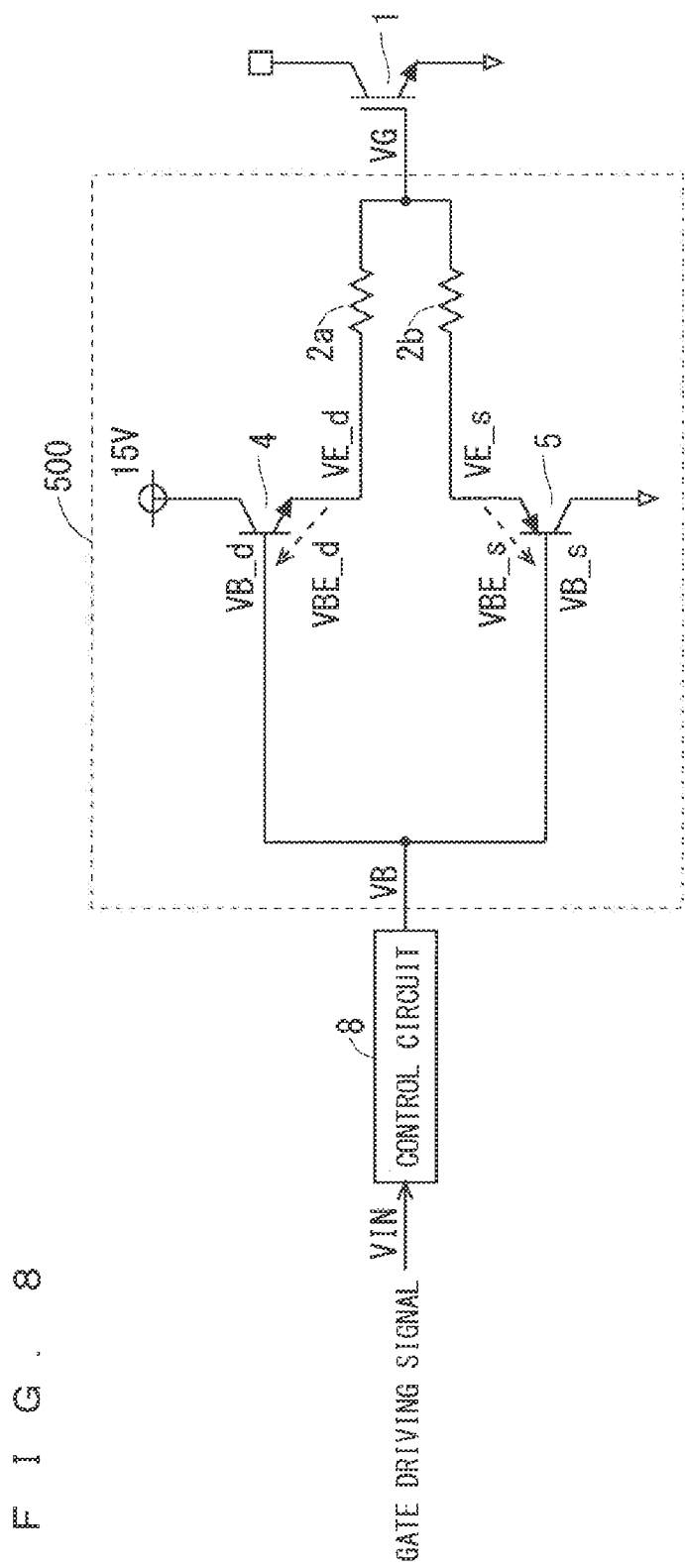
F I G . 8

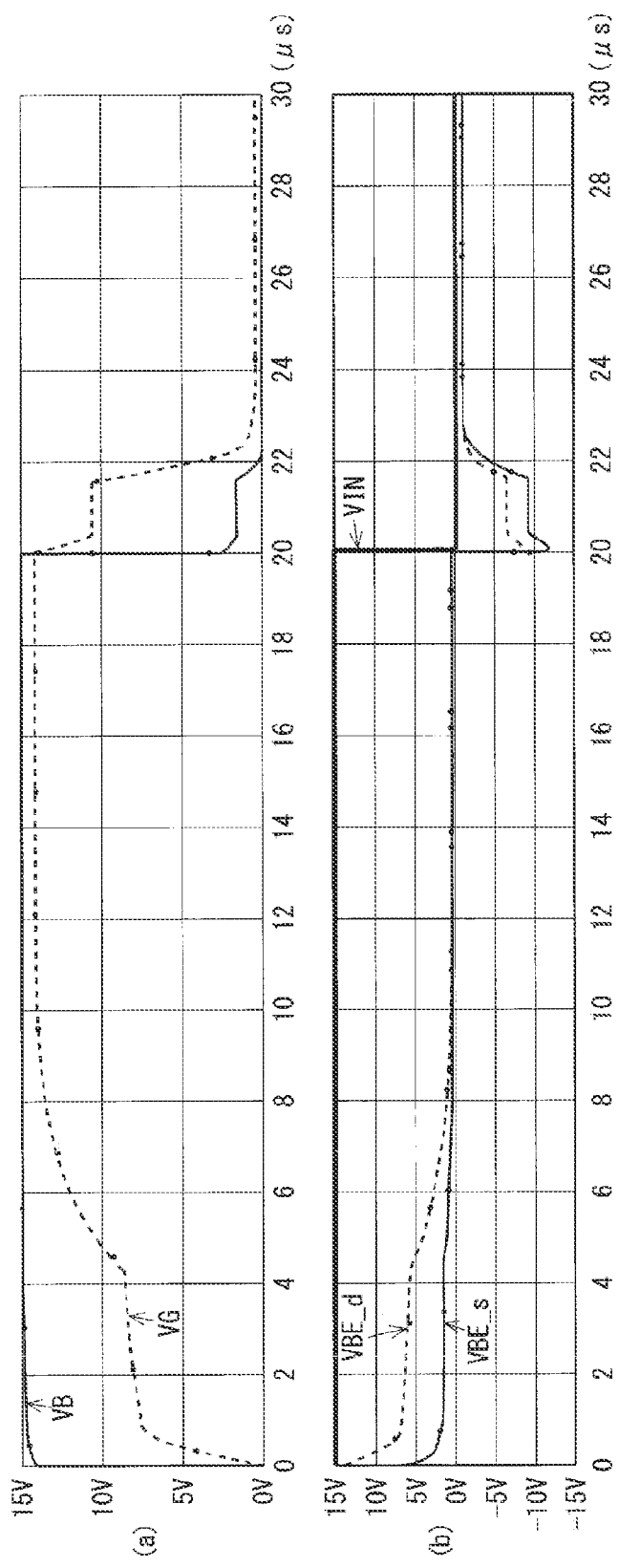

BUFFER CIRCUIT

TECHNICAL FIELD

The present invention relates to a buffer circuit, and more particularly, to a buffer circuit that turns on and turns off a switching element.

BACKGROUND ART

A switching drive of semiconductor switching elements behaves differently at the time of turn-on and turn-off that each need a different switching speed (hereinafter referred to as a SW speed). For example, radiation noise by recovery current and turn-on losses are problems during the turn-on. Meanwhile, overvoltage by surge voltage and turn-off losses are problems during the turn-off.

A technique for controlling charge and discharge current and controlling a SW speed by gate resistors having different resistance values located between each of a drive side and a sink side and a gate of a switching element has been used. In this case, the different resistors need to be located on the drive side and the sink side.

A configuration of a single ended push-pull (SEPP) circuit in which an NPN bipolar transistor and a PNP bipolar transistor are respectively located on a drive side and a sink side, and emitters of the transistors are connected to each other to output as one is often used as a buffer circuit, gate resistors being each located in the emitters of the SEPP circuit. This circuit has advantages in that a driving signal is rarely delayed due to the bipolar transistor having small input capacities, an emitter follower has low output impedance, and the circuit can easily be used at power supply voltage in a wide range without passing a flow-through current (see Patent Documents 1, 2, for example).

PRIOR ART DOCUMENT

Patent Document

Patent Document 1: Japanese Patent Application Laid-Open No. 2010-233310
Patent Document 2: Japanese Patent Application Laid-Open No. 2013-5474

SUMMARY OF INVENTION

Problems to be Solved by the Invention

In the buffer circuit in which the gate resistors are each located in the emitters of the conventional SEPP circuit, delays in a rise and a fall of a gate voltage of a semiconductor switching element during turn-on and turn-off cause application of a reverse voltage that exceeds a rating between bases and emitters of the NPN bipolar transistor and the PNP bipolar transistor. It is feared that the application of the reverse voltage that exceeds the rated voltage may reduce the performance of the buffer circuit.

The present invention has been made in view of the above mentioned problems, and an object thereof is to provide a buffer circuit that reduces a reverse voltage applied to transistors being a complementary pair during turn-on and turn-off.

Means to Solve the Problems

A buffer circuit in the present invention is a buffer circuit that turns on and turns off a switching element. The buffer circuit includes: a drive transistor that turns on the switching element; a sink transistor that turns off the switching element and forms a complementary pair with the drive transistor; a base of the drive transistor and a base of the sink transistor receiving an input of a control signal output from an output terminal of a control circuit, a drive-side element that has an end connected to the base of the drive transistor; and a sink-side element that has an end connected to the base of the sink transistor. The drive-side element and the sink-side element are respectively a drive-side diode and a sink-side diode, the drive-side diode having an anode being the other end connected to the output terminal of the control circuit, the sink-side diode having a cathode being the other end connected to the output terminal of the control circuit, or a drive-side capacitor and a sink-side capacitor, the drive-side capacitor having the other end connected to an emitter of the drive transistor, the sink-side capacitor having the other end connected to an emitter of the sink transistor.

Effects of the Invention

In the present invention, the reverse voltage applied between the base and the emitter of the drive transistor during the turn-off operations is also applied to the drive-side diode in a distributed manner This can reduce the reverse voltage applied to the drive transistor during the turn-off operations. Similarly, the reverse voltage applied between the base and the emitter of the sink transistor during the turn-on operations is also applied to the sink-side diode in a distributed manner This can reduce the reverse voltage applied to the sink transistor during the turn-on operations.

In the present invention, the drive-side capacitor is connected between the base and the emitter of the drive transistor to charge and discharge the emitter of the drive transistor during the turn-off operations, so that the reverse voltage applied to the drive transistor during the turn-off operations can be reduced. Similarly, the sink-side capacitor is connected between the base and the emitter of the sink transistor to charge and discharge the emitter of the sink transistor during the turn-on operations, so that the reverse voltage applied to the sink transistor during the turn-on operations can be reduced.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a circuit diagram of a buffer circuit according to a first embodiment.
FIG. 3 is a circuit diagram of a buffer circuit according to a second embodiment.
FIG. 6 is a diagram showing a result of a simulation of switching operations of the buffer circuit according to the third embodiment.
FIG. 7 is a circuit diagram of a buffer circuit according to a prerequisite technology.

FIG. 8 is a circuit diagram of the buffer circuit according to the prerequisite technology.

FIG. 9 is a diagram showing a result of a simulation of switching operations of the buffer circuit according to the prerequisite technology.

DESCRIPTION OF EMBODIMENTS

<Prerequisite Technology>

Figure 2:
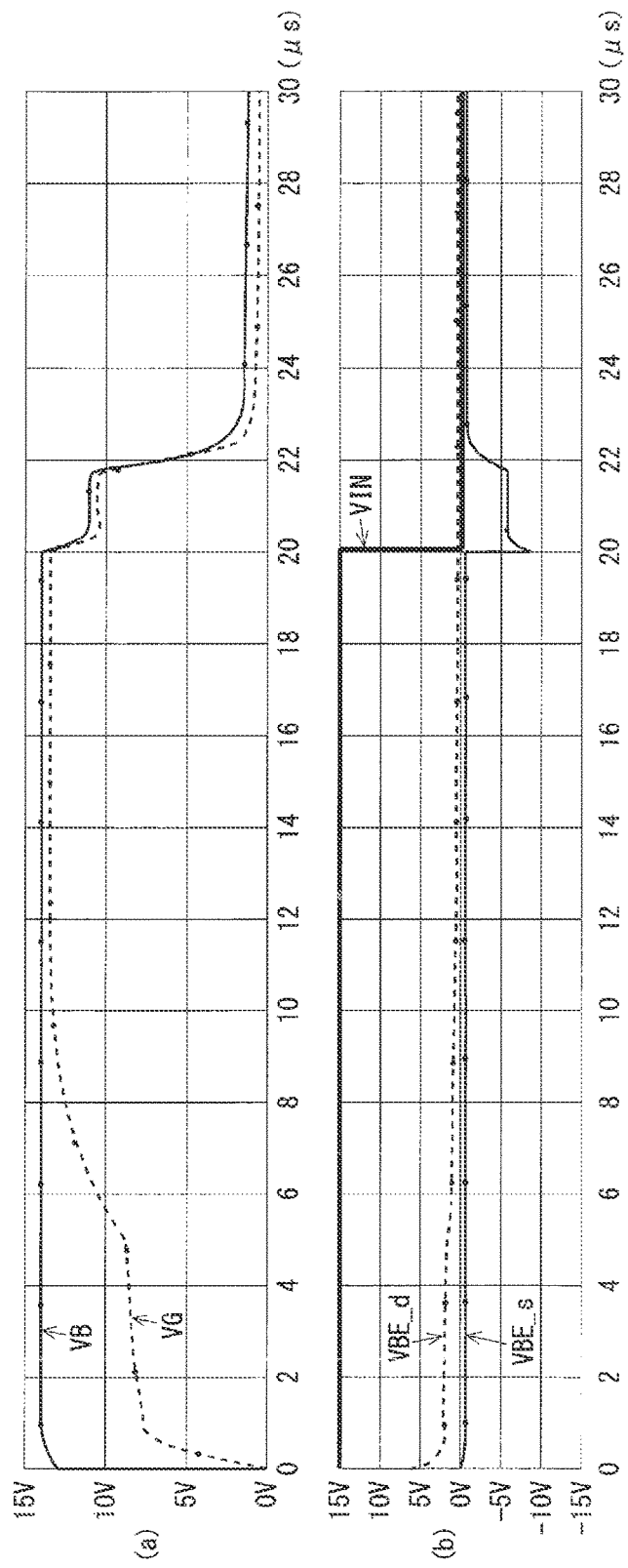
FIG. 2 is a diagram showing a result of a simulation of switching operations of the buffer circuit according to the first embodiment.

With reference to FIGS. 7 to 9, buffer circuits 400, 500 being a prerequisite technology of the present invention are described before embodiments of the present invention are described. FIG. 7 is a circuit diagram of the typical buffer circuit 400. In FIG. 7, a drive transistor 4 that turns on a switching element 1 (for example, an insulated gate bipolar transistor (IGBT)) and a sink transistor 5 that turns off the switching element 1 are a complementary pair. The drive transistor 4 and the sink transistor 5 are respectively an NPN bipolar transistor and a PNP bipolar transistor, for example.

The drive transistor 4 and the sink transistor 5 include emitters connected to a gate of the switching element 1. A control signal output from an output terminal of a control circuit 8 is input to bases of the drive transistor 4 and the sink transistor 5. A gate resistor 2 is located upstream of the gate of the switching element 1.

In this specification, VIN represents a voltage of an input signal input to the control circuit 8, VB represents a voltage of the output terminal of the control circuit 8, and VE represents an emitter voltage common to the drive transistor 4 and the sink transistor 5. VB_d and VB_s each represent base voltages of the drive transistor 4 and the sink transistor 5. VG represents a gate voltage of the switching element 1.

FIG. 8 shows the buffer circuit 500 in which the gate resistor 2 that is also used in FIG. 7 is individually located on the drive side and the sink side. In FIG. 8, a gate resistor 2a is located between the emitter of the drive transistor 4 and the gate of the switching element 1 while a gate resistor 2b is located between the emitter of the sink transistor 5 and the gate of the switching element 1. As described above, the gate resistors 2a, 2b have been individually located on the drive side and the sink side as shown in FIG. 8 to individually adjust SW speeds of the turn-on and the turn-off. In FIG. 8, VE_d and VE_s each represent emitter voltages of the drive transistor 4 and the sink transistor 5.

FIG. 9 a diagram showing a result of a simulation of switching operations of the buffer circuit 500 shown in FIG. 8. Part (a) of FIG. 9 is a diagram showing time variation of VB and VG. Part (b) of FIG. 9 is a diagram showing time variation of VBE_d, VBE_s, and VIN.

With reference to FIGS. 8 and 9, operations during the turn-on and the turn-off of the buffer circuit 500 being the prerequisite technology are described. When VIN is switched from a low level (0 V) to a high level (15 V) during the turn-on (that is to say, a time 0 μs in parts (a) and (b) of FIG. 9), the base voltage VB_d of the drive transistor 4 reaches the high level, so that the drive transistor 4 as an emitter follower charges the gate of the switching element 1. At this time, the switching element 1 has great input capacities, and there are sections referred to as mirror sections for charging a feedback current, thereby delaying a rise of VG. At the time of the rise of VG, a reverse voltage is applied between the base and the emitter of the sink transistor 5. VBE_s exceeds +6 V around the time 0 μs in part (b) of FIG. 9. The reverse voltage is defined as a voltage between an emitter and a base, and a rated reverse voltage of a bipolar transistor used for driving a gate is typically approximately 6 V, so that the reverse voltage in this embodiment exceeds the rated voltage. On the other hand, a rated reverse voltage (for example, 30 V) between a gate and a source of a MOS transistor is greater than the rating of the bipolar transistor, so that the reverse voltage rarely exceeds the rated voltage upon switching.

When VIN is switched from the high level (15 V) to the low level (0 V) during the turn-off (that is to say, a time 20 μs in part (b) of FIG. 9), the base voltage VB_s of the sink transistor 5 reaches the low level, so that the sink transistor 5 as an emitter follower discharges the gate of the switching element 1. At this time, a fall of VG is delayed. At the time of the fall of VG, the reverse voltage is applied between the base and the emitter of the drive transistor 4. VBE_d falls below −6 V around the time 20 μs in part (b) of FIG. 9. In other words, the reverse voltage exceeds the rating.

When the reverse voltage that exceeds the rated voltage is applied to transistors (namely, the drive transistor 4 and the sink transistor 5), it is feared that a breakdown may reduce the performance of the transistors and the buffer circuit. The control circuit 8 also charges and discharges an unintended breakdown current, and thus it is feared that the application of an excess load may reduce the performance of the control circuit 8. It is feared that the buffer circuits 400, 500 of the prerequisite technology may reduce the switching performance described above.

<First Embodiment>
<Configuration>

FIG. 1 is a circuit diagram of a buffer circuit 100 in this embodiment. The buffer circuit 100 is different from the buffer circuit 500 (FIG. 8) described in the prerequisite technology in that the buffer circuit 100 further includes a drive-side element and a sink-side element. The drive-side element has an end connected to a base of a drive transistor 4, and the sink-side element has an end connected to a base of a sink transistor 5.

In this embodiment, the drive-side element and the sink-side element are respectively a drive-side diode 6 and a sink-side diode 7. As shown in FIG. 1, an end (namely, cathode) of the drive-side diode 6 is connected to the base of the drive transistor 4, and the other end (namely, anode) is connected to an output terminal of a control circuit 8. An end (namely, anode) of the sink-side diode 7 is connected to the base of the sink transistor 5, and the other end (namely, cathode) is connected to the output terminal of the control circuit 8.

In other words, the drive-side diode 6 is located between the output terminal of the control circuit 8 and the base of the drive transistor 4 such that a direction of a current flowing through the base of the drive transistor 4 is a forward direction. The sink-side diode 7 is located between the output terminal of the control circuit 8 and the base of the sink transistor 5 such that a direction of a current flowing from the base of the sink transistor 5 is a forward direction. The other configuration is the same as that in the prerequisite technology (FIG. 8), and thus descriptions will be omitted.

<Operations>

FIG. 2 is a diagram showing a result of a simulation of switching operations of the buffer circuit 100 in this embodiment. Part (a) of FIG. 2 is a diagram showing time variation of VB and VG. Part (b) of FIG. 2 is a diagram showing time variation of VBE_d, VBE_s, and VIN.

When VIN is switched from a low level (0 V) to a high level (15 V) during turn-on (that is to say, a time 0 μs in parts (a) and (b) of FIG. 2), the base voltage VB_d of the drive transistor 4 reaches the high level, so that the drive transistor 4 as an emitter follower charges a gate of a switching element 1. At this time, a rise of VG is delayed as described in the prerequisite technology. At the time of the rise of VG, a reverse voltage (positive voltage) is applied between the base and the emitter of the sink transistor 5, and the positive voltage is applied to a series connection of the base and the emitter of the sink transistor 5 and the sink-side diode 7. Thus, the voltage (VBE_s) applied between the base and the emitter of the sink transistor 5 is reduced more than that in the prerequisite technology (FIG. 9).

When VIN is switched from the high level (15 V) to the low level (0 V) during turn-off (that is to say, a time 20 μs in parts (a) and (b) of FIG. 2), the base voltage VB_s of the sink transistor 5 reaches the low level, so that the sink transistor 5 as an emitter follower discharges the gate of the switching element 1. At this time, a fall of VG is delayed as described above. At the time of the fall of VG, a reverse voltage (negative voltage) is applied between the base and the emitter of the drive resistor 4, and the negative voltage is applied to a series connection of the base and the emitter of the drive transistor 4 and the drive-side diode 6. Thus, the voltage (VBE_d) applied between the base and the emitter of the drive transistor 4 is reduced more than that in the prerequisite technology (part (b) of FIG. 9).

<Effects>

The buffer circuit 100 in this embodiment is the buffer circuit 100 that turns on and turns off the switching element 1. The buffer circuit 100 includes: the drive transistor 4 that turns on the switching element 1; the sink transistor 5 that turns off the switching element 1 and forms the complementary pair with the drive transistor 4; the base of the drive transistor 4 and the base of the sink transistor 5 receiving an input of a control signal output from the output terminal of the control circuit 8, the drive-side element that has the end connected to the base of the drive transistor 4; and the sink-side element that has the end connected to the base of the sink transistor 5. The drive-side element and the sink-side element are respectively the drive-side diode 6 and the sink-side diode 7, the drive-side diode 6 having the anode being the other end connected to the output terminal of the control circuit 8, the sink-side diode 7 having the cathode being the other end connected to the output terminal of the control circuit 8, or the drive-side capacitor 12 and the sink-side capacitor 13, the drive-side capacitor 12 having the other end connected to the emitter of the drive transistor 4, the sink-side capacitor 13 having the other end connected to the emitter of the sink transistor 5.

Therefore, the base of the drive transistor 4 is connected to the drive-side diode 6 such that the direction of the current flowing through the base of the drive transistor 4 is the forward direction, so that the reverse voltage applied between the base and the emitter of the drive transistor 4 during the turn-off operations is also applied to the drive-side diode 6 in a distributed manner This can reduce the reverse voltage applied to the drive transistor 4 during the turn-off operations. Similarly, the base of the sink transistor 5 is connected to the sink-side diode 7 such that the direction of the current flowing from the base of the sink transistor 5 is the forward direction, so that the reverse voltage applied between the base and the emitter of the sink transistor 5 during the turn-on operations is also applied to the sink-side diode 7 in a distributed manner This can reduce the reverse voltage applied to the sink transistor 5 during the turn-on operations. As described above, the buffer circuit 100 in this embodiment can reduce the reverse voltage applied to the drive transistor 4 and the sink transistor 5 during the turn-on and turn-off operations, allowing for the stable operations.

Moreover, in comparison with the emitter side of the drive transistor 4 connected to the drive-side diode 6, connecting the drive-side diode 6 to the base side of the drive transistor 4 needs a small flowing current of a diode, so that a small, low-cost diode can be used as the drive-side diode 6. Similarly, in comparison with the emitter side of the sink transistor 5 connected to the sink-side diode 7, connecting the sink-side diode 7 to the base side of the sink transistor 5 needs a small flowing current of a diode, so that a small, low-cost diode can be used as the sink-side diode 7.

<Second Embodiment>

<Configuration>

FIG. 3 is a circuit diagram of a buffer circuit 200 in this embodiment. The buffer circuit 200 is different from the buffer circuit 100 (FIG. 1) described in the first embodiment in that the buffer circuit 200 further includes a resistance element 9. The resistance element 9 is connected between an output terminal of a control circuit 8 and a gate of a switching element 1. The other configuration is the same as that in the first embodiment (FIG. 1), and thus descriptions will be omitted.

<Operations>

In the buffer circuit 100 in the first embodiment, in the ON state of the switching element 1, the gate voltage (VG) of the switching element 1 can only be increased to a voltage that drops from the voltage (VB) of the output terminal of the control circuit 8 by an amount of the forward voltage (VD_d) of the drive-side diode 6 and the forward voltage (VBE_d) between the base and the emitter of the drive transistor 4. For example, when it is assumed that VB is a pulse in a range of 0 V (low level) to 15 V (high level), VD_d is approximately 0.7 V, and VBE_d is approximately 0.7 V, a maximum voltage of VG is thus approximately 13.6 V (=15 V−0.7 V−0.7 V).

A decrease in the gate voltage of the switching element 1 causes an increase in a saturation voltage in the ON state of the switching element 1, thereby increasing a steady loss.

Similarly, in the buffer circuit 100 in the first embodiment, in the OFF state of the switching element 1, the gate voltage (VG) is only discharged up to a total value of the forward voltage (VD_s) of the sink-side diode 7 and the forward voltage (VBE_s) between the base and the emitter of the sink transistor 5, so that the switching element 1 is easily turned on due to a malfunction.

Thus, the buffer circuit 200 in this embodiment provides, in addition to the emitter followers, a path that directly charges and discharges the gate of the switching element 1 from the control circuit 8 via the resistance element 9. This configuration allows the gate voltage (VG) of the switching element 1 to be increased (reduced) to a value close to the output value of 15 V (0 V) of the control circuit 8. In other words, an influence of the voltage drop (rise) by the drive transistor 4 (sink transistor 5) and the drive-side diode 6 (sink-side diode 7) can be reduced.

Figure 4:
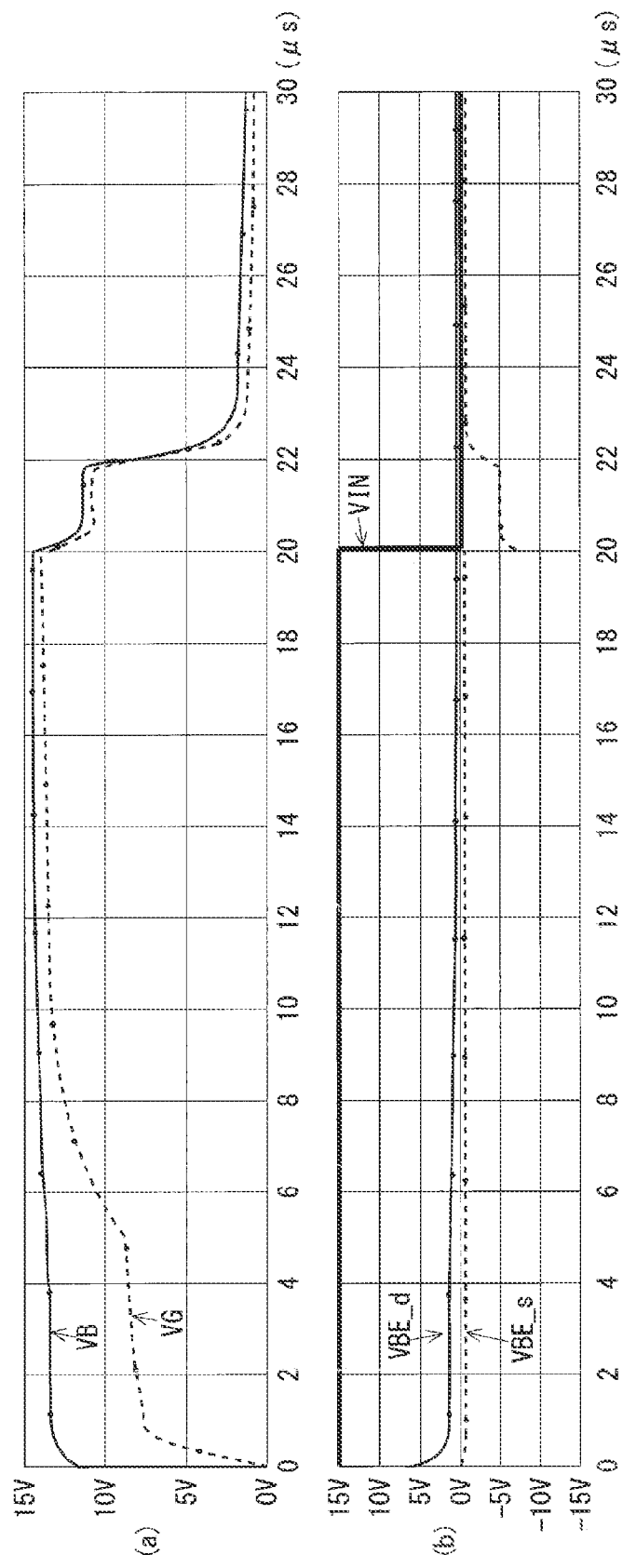
FIG. 4 is a diagram showing a result of a simulation of switching operations of the buffer circuit according to the second embodiment.

FIG. 4 is a diagram showing a result of a simulation of switching operations of the buffer circuit 200 in this embodiment. Part (a) of FIG. 4 is a diagram showing time variation of VB and VG. Part (b) of FIG. 4 is a diagram showing time variation of VBE_d, VBE_s, and VIN.

As the resistance element 9 has a smaller resistance value, time needed for the charge and the discharge is shortened, but the control circuit 8 has a greater load current.

For this reason, the resistance element 9 preferably has the resistance value set to several hundreds of Ω or more. When the time variation of the gate voltage (VG) shown in part (a) of FIG. 2 is compared to that shown in part (a) of FIG. 4, it is clear that VG is increased more gradually and converges to VB in this embodiment (part (a) of FIG. 4).

<Effects>

The buffer circuit 200 in this embodiment further includes, when the drive-side element and the sink-side element are respectively the drive-side diode 6 and the sink-side diode 7, the resistance element 9 connected between the output terminal of the control circuit 8 and the gate of the switching element 1.

Therefore, connecting the output terminal of the control circuit 8 and the gate of the switching element 1 via the resistance element 9 allows the gate voltage (VG) of the switching element 1 closer to the output voltage (VB) of the control circuit 8. Thus, in addition to the effects described in the first embodiment, the steady loss of the switching element 1 can be reduced, and the malfunction of the switching element 1 can be prevented.

<Third Embodiment>
<Configuration>

Figure 5:
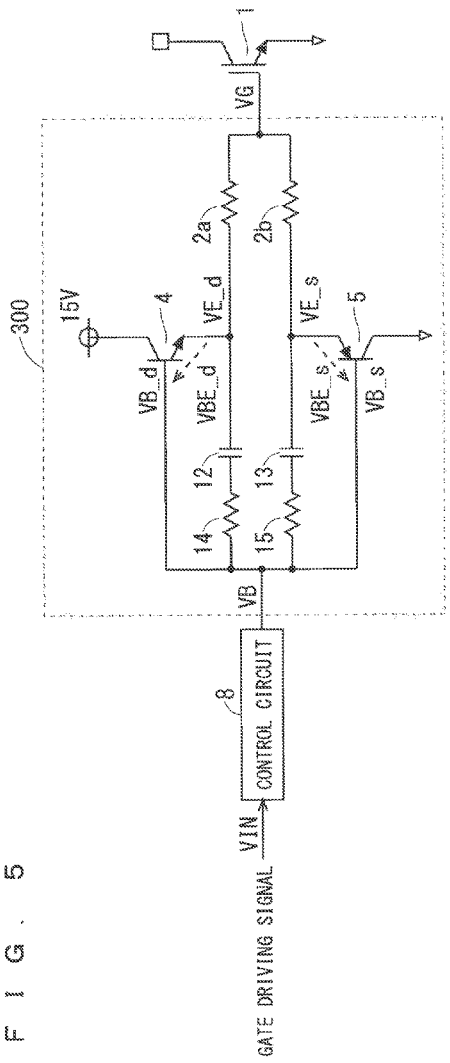
FIG. 5 is a circuit diagram of a buffer circuit according to a third embodiment.

FIG. 5 is a circuit diagram of a buffer circuit 300 in this embodiment. The buffer circuit 300 is different from the buffer circuit 500 (FIG. 8) described in the prerequisite technology in that the buffer circuit 300 further includes a drive-side element and a sink-side element. The drive-side element has an end connected to a base of a drive transistor 4, and the sink-side element has an end connected to a base of a sink transistor 5.

In this embodiment, the drive-side element and the sink-side element are respectively a drive-side capacitor 12 and a sink-side capacitor 13. The drive-side capacitor 12 has the other end connected to an emitter of the drive transistor 4. The sink-side capacitor 13 has the other end connected to an emitter of the sink transistor 5.

In other words, the drive-side capacitor 12 is located between the base and the emitter of the drive transistor 4, and the sink-side capacitor 13 is located between the base and the emitter of the sink transistor 5.

In the buffer circuit 300 in this embodiment, as shown in FIG. 5, a resistance element 14 is connected in series to the drive-side capacitor 12, and a resistance element 15 is connected in series to the sink-side capacitor 13. It suffices that the resistance element 14 is located between the base and the emitter of the drive transistor 4 and is connected in series to the drive-side capacitor 12. Similarly, it suffices that the resistance element 15 is located between the base and the emitter of the sink transistor 5 and is connected in series to the sink-side capacitor 13. The other configuration is the same as that in the prerequisite technology (FIG. 8), and thus descriptions will be omitted.

<Operations>

FIG. 6 is a diagram showing a result of a simulation of switching operations of the buffer circuit 300 in this embodiment. Part (a) of FIG. 6 is a diagram showing time variation of VB and VG. Part (b) of FIG. 6 is a diagram showing time variation of VBE_d, VBE_s, and VIN.

The greatest reverse voltage is applied between the base and the emitter of the drive transistor 4 at the instant when the output voltage VB of the control circuit 8 is switched from the high level to the low level. The emitter of the drive transistor 4 is charged and discharged via the drive-side capacitor 12 at low impedance at high frequencies, allowing for a reduction in the reverse voltage. When VBE_d around the time 20 μs in part (b) of FIG. 6 is compared to that shown in part (b) of FIG. 9, it is clear that the reverse voltage is reduced.

Similarly, the greatest reverse voltage is applied between the base and the emitter of the sink transistor 5 at the instant when the output voltage VB of the control circuit 8 is switched from the low level to the high level. The emitter of the sink transistor 5 is charged and discharged via the sink-side capacitor 13 at low impedance at high frequencies, allowing for a reduction in the reverse voltage. When VBE_s around the time 0 μs in part (b) of FIG. 6 is compared to that shown in part (b) of FIG. 9, it is clear that the reverse voltage is reduced.

The resistance elements 14, 15 are limiting resistors for adjusting a load current to the control circuit 8. The resistance elements 14, 15 can be substituted with the gate resistors 2a, 2b, but the resistance elements 14, 15 can adjust SW speeds more finely.

<Effects>

The buffer circuit 300 in this embodiment is the buffer circuit 300 that turns on and turns off the switching element 1. The buffer circuit 300 includes: the drive transistor 4 that turns on the switching element 1; the sink transistor 5 that turns off the switching element 1 and forms the complementary pair with the drive transistor 4; the base of the drive transistor 4 and the base of the sink transistor 5 receiving an input of a control signal output from the output terminal of the control circuit 8, the drive-side element that has the end connected to the base of the drive transistor 4; and the sink-side element that has the end connected to the base of the sink transistor 5. The drive-side element and the sink-side element are respectively the drive-side diode 6 and the sink-side diode 7, the drive-side diode 6 having the anode being the other end connected to the output terminal of the control circuit 8, the sink-side diode 7 having the cathode being the other end connected to the output terminal of the control circuit 8, or the drive-side capacitor 12 and the sink-side capacitor 13, the drive-side capacitor 12 having the other end connected to the emitter of the drive transistor 4, the sink-side capacitor 13 having the other end connected to the emitter of the sink transistor 5.

Therefore, the drive-side capacitor 12 is connected between the base and the emitter of the drive transistor 4 to charge and discharge the emitter of the drive transistor 4 during the turn-off operations, so that the reverse voltage applied to the drive transistor 4 during the turn-off operations can be reduced. Similarly, the sink-side capacitor 13 is connected between the base and the emitter of the sink transistor 5 to charge and discharge the emitter of the sink transistor 5 during the turn-on operations, so that the reverse voltage applied to the sink transistor 5 during the turn-on operations can be reduced. As described above, the buffer circuit 300 in this embodiment includes small discrete elements (the drive-side capacitor 12 and the sink-side capacitor 13) added to the buffer circuit 500 (FIG. 8) in the prerequisite technology, so that the reverse voltage applied to the drive transistor 4 and the sink transistor 5 during the turn-on and turn-off operations can be reduced. Thus, the buffer circuit 300 allows for the stable operations.

The buffer circuit 300 in this embodiment further includes, when the drive-side element and the sink-side element are respectively the drive-side capacitor 12 and the sink-side capacitor 13: the resistance element 14 located between the base and the emitter of the drive transistor 4 and connected in series to the drive-side capacitor 12; and the resistance element 15 located between the base and the emitter of the sink transistor 5 and connected in series to the sink-side capacitor 13.

Therefore, the drive-side capacitor 12 and the sink-side capacitor 13 are respectively connected in series to the resistance element 14 and the resistance element 15, which can adjust the load current to the control circuit 8 and the SW speeds.

In the first to third embodiments, the switching element 1 as the IGBT is described as the example, and the effects of the present invention can also be obtained when a bipolar transistor, a MOSFET made of silicon, or a MOSFET made of silicon carbide (SiC) is used instead of the IGBT.

While the invention has been shown and described in detail, the foregoing description is in all aspects illustrative and not restrictive. The present invention is not restricted to the material quality, the materials, the execution conditions and the like of the respective components which are described, for example. It is therefore understood the numerous modifications and variations can be devised without departing from the scope of the invention.

DESCRIPTION OF NUMERALS 1 switching element; 2, 2a, 2b gate resistor; 4 drive transistor; 5 sink transistor; 6 drive-side diode; 7 sink-side diode; 8 control circuit; 9, 14, 15 resistance element; 12 drive-side capacitor; 13 sink-side capacitor; 100, 200, 300, 400, 500 buffer circuit.

The invention claimed is:

1. A buffer circuit that turns on and turns off a switching element, said buffer circuit comprising:
 a drive transistor that turns on said switching element;
 a sink transistor that turns off said switching element and forms a complementary pair with said drive transistor;
  a base of said drive transistor and a base of said sink transistor receiving an input of a control signal output from an output terminal of a control circuit,
 a drive-side element that has an end connected to the base of said drive transistor; and
 a sink-side element that has an end connected to the base of said sink transistor,
 wherein said drive-side element and said sink-side element are respectively a drive-side diode and a sink-side diode, said drive-side diode having an anode being the other end connected to said output terminal of said control circuit, said sink-side diode having a cathode being the other end connected to said output terminal of said control circuit,
 an emitter of said drive transistor is connected to a gate of said switching element without the base of said drive transistor therebetween,
 an emitter of said sink transistor is connected to the gate of said switching element without the base of said sink transistor therebetween,
 said drive transistor is an NPN bipolar transistor,
 said sink transistor is a PNP bipolar transistor,
 no resistive or capacitive element is directly connected between a connecting line and an output of said buffer circuit, and
 said connecting line connects said base of said drive transistor and a cathode of said drive-side diode.

2. The buffer circuit according to claim 1, further comprising
 a resistance element connected between said output terminal of said control circuit and the gate of said switching element.

3. A buffer circuit that turns on and turns off a switching element, said buffer circuit comprising:
 a drive transistor that turns on said switching element;
 a sink transistor that turns off said switching element and forms a complementary pair with said drive transistor;
  a base of said drive transistor and a base of said sink transistor receiving an input of a control signal output from an output terminal of a control circuit,
 a drive-side element that has an end connected to the base of said drive transistor;
 a sink-side element that has an end connected to the base of said sink transistor;
 wherein said drive-side element and said sink-side element are respectively a drive-side capacitor and a sink-side capacitor, said drive-side capacitor having the other end connected to an emitter of said drive transistor, said sink-side capacitor having the other end connected to an emitter of said sink transistor,
 said buffer circuit further comprising:
 a resistance element located between the base and the emitter of said drive transistor and connected in series to said drive-side capacitor; and
 a resistance element located between the base and the emitter of said sink transistor and connected in series to said sink-side capacitor.

* * * * *